United States Patent [19]

Küsters et al.

[11] Patent Number: 5,747,388

[45] Date of Patent: May 5, 1998

[54] ANTIREFLECTION LAYER AND PROCESS FOR LITHOGRAPHICALLY STRUCTURING A LAYER

[75] Inventors: Karl-Heinz Küsters, St. Cloud, France; Paul Küpper, Glonn, Germany; Günther Czech; Hellmut Joswig, both of München, Germany

[73] Assignee: Siemens Aktiengesellschaft, Munich, Germany

[21] Appl. No.: 406,669

[22] Filed: Mar. 20, 1995

Related U.S. Application Data

[63] Continuation of PCT/DE93/00857, Sep. 14, 1993.

[30] Foreign Application Priority Data

Sep. 18, 1992 [DE] Germany ............ 42 31 312.0

[51] Int. Cl.$^6$ ........................................ H01L 21/302
[52] U.S. Cl. ............... 438/723; 438/724; 438/952; 430/316; 430/950
[58] Field of Search ............ 156/659.11, 661.11; 430/316, 317, 950, 315; 438/723, 724, 952

[56] References Cited

U.S. PATENT DOCUMENTS

| | | | |
|---|---|---|---|
| 4,541,892 | 9/1985 | Jeuch | 156/659.11 |
| 4,563,367 | 1/1986 | Sherman | 216/67 |
| 4,714,668 | 12/1987 | Uneno et al. | 156/659.11 |
| 5,141,564 | 8/1992 | Chen et al. | 437/5 |
| 5,254,488 | 10/1993 | Haller | 437/181 |
| 5,258,608 | 11/1993 | Uchiya | 250/208.1 |
| 5,360,510 | 11/1994 | Kadomura | 216/79 |
| 5,398,133 | 3/1995 | Tsai et al. | 359/589 |
| 5,418,019 | 5/1995 | Chen et al. | 427/579 |

FOREIGN PATENT DOCUMENTS

| | | |
|---|---|---|
| 0 098 582 | 1/1984 | European Pat. Off. |
| 0 379 604 | 8/1990 | European Pat. Off. |
| 34 28 565 | 3/1985 | Germany |
| 1-015951 | 1/1989 | Japan |
| 1-270280 | 10/1989 | Japan |
| 2 145 243 | 3/1985 | United Kingdom |

OTHER PUBLICATIONS

Patent Abstract of Japan No. JP 1015951 (Masato) May 10, 1989.

8226 Microelectronic Eng. Publ. 21(1993)Apr., No.1/4, pp. 51–56, "Reduction of Linewidth Variation for the . . . ".

*Primary Examiner*—R. Bruce Breneman
*Assistant Examiner*—Anita Alanko
*Attorney, Agent, or Firm*—Herbert L. Lerner; Laurence A. Greenberg

[57] ABSTRACT

A thick layer formed of aSi or aSi/aSiN is used as an antireflection layer (3) in the lithographic structuring of layers (2) on a semiconductor substrate (1). A reflection suppression is based on absorption in the aSi layer and on interference in the aSiN layer. An optical decoupling of the background is achieved, with the result that the antireflection layer can be used universally.

12 Claims, 1 Drawing Sheet

ANTIREFLECTION LAYER AND PROCESS FOR LITHOGRAPHICALLY STRUCTURING A LAYER

CROSS-REFERENCE TO RELATED APPLICATION

This application is a continuation of International Application Ser. No. PCT/DE93/00857, filed Sep. 14, 1993.

BACKGROUND OF THE INVENTION

FIELD OF THE INVENTION

The invention relates to a process for patterning or structuring a layer on a semiconductor substrate using a photoresist mask and an etching process, to a semiconductor structure having a layer to be structured and to a process for lithographic patterning or structuring of layers using an aSi/aSiN layer as an antireflection layer.

In semiconductor technology, the problem of troublesome reflections is known in the lithographic structuring of applied layers. Depending on optical properties such as, for example, the refractive index and the absorption coefficient, of the layers applied to the semiconductor substrate, including those of the photoresist, reflection and refraction of the light used to expose the photoresist occurs at all of the layer interfaces. Back-reflection into the photoresist takes place, for example, at the surface of the layer to be structured and interference and absorption result in undesirable local intensity variations.

That problem can be reduced by antireflection layers which are applied over the entire surface before the photoresist layer. Line-width variations due to different resist thicknesses are reduced and the effect of reflections at edges is reduced, as a result of which the use of so-called high-contrast resists is possible. The antireflection layer is normally immediately below the photoresist layer, with the result that the antireflection layer has first to be etched before the layer can be structured. Inter alia, in order to ensure the dimensional accuracy during structuring and to keep the processing duration as short as possible, antireflection layers which are as thin as possible are generally used. The action of such thin antireflection layers is based primarily on interference effects, and specifically on interference in the antireflection layer or in all of the optically active layers, i.e. the layers reached by the exposure. Precise layer thicknesses, which also depend, in particular, on the optical properties of all of the underlying optically active layers, therefore have to be maintained for antireflection layers. If one of the underlying layers has a different layer thickness at different points on the semiconductor substrate, a satisfactory antireflection action is hardly likely to be achieved.

It is known to use a thin aSi (amorphous silicon) layer as an antireflection layer. Its action is based on interference and therefore, as already explained, it requires a layer thickness which is precisely matched to the underlying layers and is in the order of magnitude of a few nm since the refractive index is relatively high (approximately 4–5.5). Satisfactory results can only be achieved on highly reflective layers such as aluminum. If the layer to be structured is partly transparent, the aSi layer thickness has to be kept within narrower limits than is possible by process engineering.

The use of antireflection layers is particularly attractive for polysilicon layers or polycide layers, such as those used for transistor gates. In that case, it is also very important to keep the line-width tolerances small during structuring since they directly determine the electrical properties of the circuit. In the case of the polysilicon layers or polycide layers of the transistor gate, it is often necessary to apply an oxide layer or a nitride layer which is disposed on top of the layers and which is structured with the same photoresist mask as the polysilicon layer, for example, in order to be able to produce a later self-aligned contact to the source/drain regions of the transistor. Due to the optical properties of the combined layer system, such as oxide on polysilicon, a reflection suppression can only be achieved with difficulty. Without using an antireflection layer, the reflectivity is about 23 to 36%, depending on the oxide-layer thickness on polysilicon.

In the case of the layer system being formed of an oxide on polysilicon (and also polycide), the following antireflection layers are suitable:

silicon nitride between oxide and polysilicon. In that case the layer thickness of the nitride must be kept within narrow limits (57 to 67 nm). At steps (topography underneath the resist layer) having a slope of less than 40°, the reflectivity in the photoresist can be kept below 15%;

aSiN between oxide and polysilicon, with nitrogen being incorporated in an amorphous silicon layer, for example, during sputtering. The thickness of the aSiN layer must be about 36 to 62 nm, with the reflectivity in the resist then being up to 15%.

In both cases, the antireflection layer is disposed underneath the oxide layer and can no longer be removed in processes which follow later. That is disadvantageous for various reasons. For example, appreciable stresses are exerted on the underlying layers by a nitride layer of the required thickness. Furthermore, the thickness of the oxide layer cannot be freely chosen.

A further antireflection layer is titanium nitride, with a reflection suppression being achieved by light absorption. However, the structuring of the titanium nitride layer and, in particular, its removal after the etching of the layer to be structured, presents problems. During the removal of the titanium nitride layer it is necessary to ensure that no residues remain on the semiconductor structure since such a metal contamination can considerably impair the serviceability of the circuit as a result of subsequent high-temperature steps. Titanium nitride is therefore not suitable, for example, for structuring in the gate level.

SUMMARY OF THE INVENTION

It is accordingly an object of the invention to provide an antireflection layer and a process for lithographically structuring a layer, which overcome the hereinafore-mentioned disadvantages of the heretofore-known products and processes of this general type and in which the antireflection layer can be used universally, i.e. in which it effects a good reflection suppression with any underlying layer and without its layer thickness, for example, having to be specifically modified. It should be simple to etch and not have any disadvantageous effects on later processing steps. The process should make it possible to pattern any desired layer on a semiconductor substrate using a photoresist mask while troublesome reflections are substantially reduced in the exposure of the photoresist.

With the foregoing and other objects in view there is provided, in accordance with the invention, in a process for structuring a layer on a semiconductor substrate using a photoresist mask and an etching process, the improvement which comprises applying an aSi/aSiN double layer as an antireflection layer before generating the photoresist mask;

and adjusting a layer thickness d of the aSi layer to essentially satisfy a condition $d > -\ln(I/I_o)/\alpha(\lambda)$, where $\alpha(\lambda)$ is an absorption coefficient of the aSi layer at an exposure wavelength $\lambda$ and $(1-I/I_o)$ is a given absorption in the antireflection layer.

With the objects of the invention in view, there is also provided in a process for lithographic structuring of a layer or multilayer applied to a semiconductor substrate, the improvement which comprises applying an aSi/aSiN double layer as an antireflection layer; and adjusting a layer thickness d of the aSi layer for essentially satisfying a condition $d > -\ln(I/I_0)/\alpha(\lambda)$, where $a(\lambda)$ is an absorption coefficient of the aSi layer at an exposure wavelength $\lambda$ and $(1-I/IO)$ is a given absorption in the antireflection layer.

With the objects of the invention in view, there is additionally provided a semiconductor structure, comprising a semiconductor substrate; a layer or multilayer to be structured being applied on the semiconductor substrate; and an aSi/aSiN double layer being applied as an antireflection layer on the layer or multilayer to be structured, the aSi layer having a layer thickness essentially satisfying a condition $d \geq -\ln(I/I_O)/\alpha(\lambda)$, where $\alpha(\lambda)$ is an absorption coefficient of the aSi layer at an exposure wavelength $\lambda$ and $(1-I/I_O)$ is a given absorption.

In accordance with another mode of the invention, there is provided a process which comprises applying the antireflection layer to the layer to be structured; generating the photoresist mask by applying, exposing and developing a photoresist; removing the antireflection layer with an etching process at points being laid bare; removing the layer to be structured with an etching process at points being laid bare; and removing the photoresist mask.

In accordance with a further mode of the invention, there is provided a process which comprises carrying out the step of removing the photoresist mask in an etching process, before the step of removing the layer to be structured at the points being laid bare.

In accordance with an added mode of the invention, there is provided a process which comprises forming the antireflection layer by placing a 45–65 nm thick aSiN layer on top of a 70–100 nm thick aSi layer.

In accordance with an additional mode of the invention, there is provided a process which comprises subsequently removing the antireflection layer.

In accordance with yet another mode of the invention, there is provided a process which comprises subsequently oxidizing the antireflection layer.

In accordance with yet a further mode of the invention, there is provided a process which comprises forming the layer to be structured as a multilayer.

In accordance with yet an added mode of the invention, there is provided a process which comprises forming the layer to be structured as a multilayer having an upper sublayer and a lower sublayer; and removing the layer to be structured at the points being laid bare by initially only removing the upper sublayer, and removing the lower sublayer in an etching process at its points being laid bare, following the last process step or at the same time as the removal of the antireflection layer.

In accordance with a concomitant mode of the invention, there is provided a process which comprises initially removing the aSiN layer and then simultaneously removing the aSi layer and the lower sublayer, during the removal of the antireflection layer.

The invention is based on the use of an aSi/aSiN double layer as an antireflection layer, and the layer thickness d being chosen in such a way that an adequate absorption of the exposure wavelength $\lambda$ is ensured.

An absorption of 85% of the intensity $I_o$ entering the antireflection layer is generally regarded as adequate, with the result that the required layer thickness is at least $d = -\ln 0.15/\alpha(\lambda) = 1.9/\alpha(\lambda)$. Generally, for a given absorption $1-I/I_o$, the layer thickness must be at least $d = -\ln(I/I_o)/\alpha(\lambda)$, where $\alpha(\lambda)$ is the absorption coefficient of the aSi layer, which can be determined, for example, with a spectral ellipsometer.

In the case of an exposure with UV light (exposure wavelength $\lambda = 436$ nm, g-line) and a refractive index of about 4.8, for example, an approximately 70–100 nm thick aSi layer is applied. The advantage of the asi/aSiN layer is based on the fact that the refractive index of aSiN is between that of aSi and the photoresists which are normally used. Reflections at the antireflection layer/resist interface in the resist can be reduced by the interference which occurs in the aSiN layer. The antireflection layer according to the invention achieves an optical decoupling of the background, i.e. in particular, of the layer to be structured, so that the antireflection layer according to the invention can be used universally without special adjustment.

The antireflection layer can be used particularly advantageously in i-line exposure since without it, the reflectivity of a polysilicon/oxide double layer is up to 60%.

In addition to the universal applicability, the advantage of the invention is the use of materials which are standard in semiconductor technology and which are not a processing risk and are known for a multiplicity of etching processes. In conjunction with the layer thickness of the antireflection layer, which is the same everywhere, the etching processes guarantee, for example, a good dimensional accuracy when they are structured. The antireflection layer can easily be removed after structuring the underlying layer or layers, but it can also remain on the layer and possibly be completely oxidized. The electrical properties of the circuit or the subsequent processing steps are not impaired by the process according to the invention.

Other features which are considered as characteristic for the invention are set forth in the appended claims.

Although the invention is illustrated and described herein as embodied in an antireflection layer and a process for lithographically structuring a layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
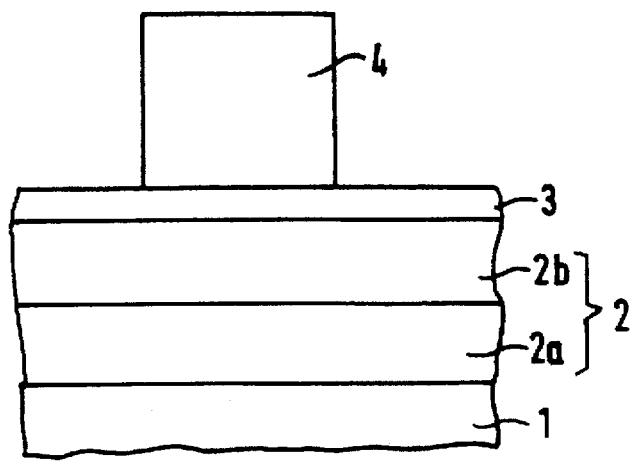
FIGS. 1 to 3 are fragmentary, diagrammatic, cross-sectional views of a semiconductor structure illustrating steps in an embodiment of a process and of a semiconductor structure according to the invention.

Referring now to the figures of the drawing in detail and first, particularly, to FIG. 1 thereof, there is seen a semiconductor substrate 1 on which there is a double layer being formed of silicon oxide as an upper sublayer 2b and polysilicon as a lower sublayer 2a of a layer 2 to be structured or patterned. On top of the layer 2 there is an aSi/aSiN layer 3 over the entire surface which is applied, for example, by sputtering processes. The layer thicknesses are preferably about 70–100 nm aSi and 45–65 nm aSiN on top of the latter. In this connection, the most suitable layer thickness is dependent, inter alia, on the refractive indices and absorption coefficients $\alpha(\lambda)$ of aSi, aSi/N and photoresist, and on an exposure wavelength $\lambda$, but not on the properties of the underlying layers 2a, 2b or of further non-illustrated underlying layers.

In the exemplary embodiment, the refractive index (real part) of aSi at $\lambda=436$ nm is about 4.8 and that of aSiN is about 2.3, while the absorption coefficient of aSi is about 19 $\mu m^{-1}$.

The thicknesses of the layers to be structured can be freely chosen. On top of the antireflection layer 3 is a photoresist mask 4 which has been generated by applying, exposing (exposure wavelength $\lambda=436$ nm) and developing a photoresist layer. Due to the antireflection layer, for example, the line-width variation in the photoresist mask 4 is extremely small.

Figure 2:
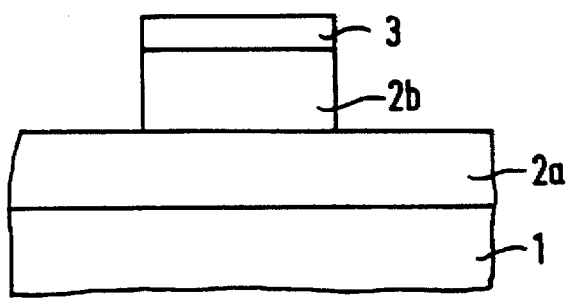

As is seen in FIG. 2, the antireflection layer 3 is structured in an anisotropic etching process using the photoresist mask 4. For this purpose, a polysilicon etching process is used which is selective for oxide, or a polysilicon/oxide-etching process which is also used for the oxide etching. In the first case, the oxide sublayer 2b is then etched with a further etching process at the locations which are laid bare.

Finally, the photoresist mask 4 is removed.

Figure 3:
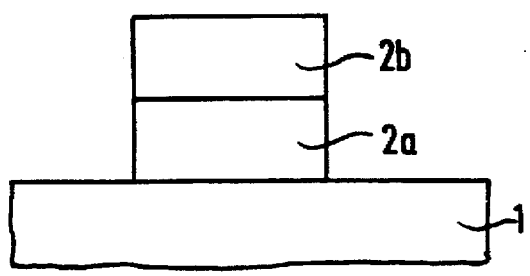

According to FIG. 3, the aSiN which is laid bare is preferably then etched. The etching may be selective for the polysilicon sublayer 2a or may be carried out with an etching process which is also used for the polysilicon etching. Polysilicon is then etched using the layers that are still present on top of it as a mask. Preferably, the residual antireflection layer (aSi) 3 is removed at the same time during this process, with the result that only the oxide sublayer 2b is the mask by the end of the etching. As a result of the relatively long overetching time (for example in the etching of the polysilicon layer for transistor gates), even a relatively thick aSi layer can be reliably removed. The etching process must be sufficiently selective for oxide.

The process can be varied at several points. Thus, for example, the resist mask may be used only for the structuring of the antireflection layer 3 and then removed. The structuring of the layer (in this case of the oxide) is then carried out with the antireflection layer as a mask using a suitably selective etching process. The photoresist mask may also be removed before the antireflection layer is completely etched through at the points which are laid bare. The antireflection layer can be selectively removed following the structuring of the layer or multilayer or may be left on the semiconductor structure and possibly converted into a non-conducting layer, for example by oxidation. The aSiN layer and aSi layer may optionally be removed with an etching process.

We claim:

1. In a process for structuring a layer on a semiconductor substrate using a photoresist mask and an etching process, the improvement which comprises:

applying an aSi/aSiN double layer as an antireflection layer before generating the photoresist mask; and adjusting a layer thickness d of the aSi layer to essentially satisfy a condition $d \geq -\ln(I/I_o)/\alpha(\lambda)$, where $\alpha(\lambda)$ is an absorption coefficient of the aSi layer at an exposure wavelength $\lambda$ and $(1-I/I_o)$ is a given absorption in the antireflection layer.

2. The process according to claim 1, which comprises:

applying the antireflection layer to the layer to be structured;

generating the photoresist mask by applying, exposing and developing a photoresist;

removing the antireflection layer with an etching process at points being laid bare;

removing the layer to be structured with an etching process at points being laid bare; and removing the photoresist mask.

3. The process according to claim 2, which comprises carrying out the step of removing the photoresist mask in an etching process, before the step of removing the layer to be structured at the points being laid bare.

4. The process according to claim 1, which comprises forming the antireflection layer by placing a 45–65 nm thick aSiN layer on top of a 70–100 nm thick aSi layer.

5. The process according to claim 2, which comprises subsequently removing the antireflection layer.

6. The process according to claim 2, which comprises subsequently oxidizing the antireflection layer.

7. The process according to claim 1, which comprises forming the layer to be structured as a multilayer.

8. The process according to claim 2, which comprises:

forming the layer to be structured as a multilayer having an upper sublayer and a lower sublayer; and removing the layer to be structured at the points being laid bare by initially only removing the upper sublayer, and removing the lower sublayer in an etching process at its points being laid bare, following the last process step.

9. The process according to claim 2, which comprises:

forming the layer to be structured as a multilayer having an upper sublayer and a lower sublayer; and removing the layer to be structured at the points being laid bare by initially only removing the upper sublayer, and removing the lower sublayer in an etching process at its points being laid bare, at the same time as the removal of the antireflection layer.

10. The process according to claim 8, which comprises initially removing the aSiN layer and then simultaneously removing the aSi layer and the lower sublayer, during the removal of the antireflection layer.

11. The process according to claim 9, which comprises initially removing the aSiN layer and then simultaneously removing the aSi layer and the lower sublayer, during the removal of the antireflection layer.

12. In a process for lithographic structuring of a layer or multilayer applied to a semiconductor substrate, the improvement which comprises:

applying an aSi/aSiN double layer as an antireflection layer; and adjusting a layer thickness d of the aSi layer for essentially satisfying a condition $d \geq -\ln(I/I_o)/\alpha(\lambda)$, where $\alpha(\lambda)$ is an absorption coefficient of the aSi layer at an exposure wavelength $\lambda$ and $(1-I/I0)$ is a given absorption in the antireflection layer.

* * * * *